(12) United States Patent
Heidmann et al.

(10) Patent No.: US 10,476,251 B2
(45) Date of Patent: Nov. 12, 2019

(54) SET OF HIGH-VOLTAGE CABLES AND METHOD FOR PRODUCING A SET OF HIGH-VOLTAGE CABLES

(71) Applicants: IPH Institut "Prueffeld fuer elektrische Hochleistungstechnik" GmbH, Berlin (DE); Polymerics GmbH, Berlin (DE); HPS Berlin GmbH Hochspannungspruefungen & Beratung, Berlin (DE)

(72) Inventors: Gerd Heidmann, Berlin (DE); Aniela Leistner, Hoppegarten OT Birkenstein (DE); André Leistner, Hoppegarten OT Birkenstein (DE); Daniel Siebler, Berlin (DE); Philipp Rohwetter, Berlin (DE); Wolfgang Habel, Berlin (DE); Ronald Plath, Berlin (DE)

(73) Assignees: IPH Institut "Prueffeld fuer elektrische Hochleistungstechnik" GmbH, Berlin (DE); Polymerics GmbH, Berlin (DE); HPS Berlin GmbH Hochspannungspruefungen & Beratung, Berlin (DE)

( * ) Notice: Subject to any disclaimer, the term of this patent is extended or adjusted under 35 U.S.C. 154(b) by 1 day.

(21) Appl. No.: 15/549,737

(22) PCT Filed: May 10, 2016

(86) PCT No.: PCT/DE2016/000205
§ 371 (c)(1),
(2) Date: Aug. 9, 2017

(87) PCT Pub. No.: WO2016/180396
PCT Pub. Date: Nov. 17, 2016

(65) Prior Publication Data
US 2018/0062370 A1 Mar. 1, 2018

(30) Foreign Application Priority Data
May 12, 2015 (DE) .................. 10 2015 107 479

(51) Int. Cl.
*H02G 15/04* (2006.01)
*H02G 15/02* (2006.01)
(Continued)

(52) U.S. Cl.
CPC ....... *H02G 15/046* (2013.01); *G01R 31/1272* (2013.01); *H01B 3/46* (2013.01);
(Continued)

(58) Field of Classification Search
CPC ...... H01B 9/006; H01B 3/46; G01R 31/1272; H02G 1/14; H02G 15/184; H02G 15/064; H02G 15/02; H02G 15/003
See application file for complete search history.

(56) References Cited

U.S. PATENT DOCUMENTS 4,179,619 A * 12/1979 Cook .................. H01L 31/167
250/239
4,399,064 A 8/1983 Penneck
(Continued)

FOREIGN PATENT DOCUMENTS

DE        20 50 581 A1    4/1971
DE   10 2004 051 734 A1    7/2005
(Continued)

OTHER PUBLICATIONS

IEC 60840 Ed. 4, 2011, "Power cables with extruded insulation and their accessories for rated voltages above 30 kV (Um = 36 kV) up to 150 kV (Um = 170 kV)—Test methods and requirements", 142 pages.
International Search Report of PCT/DE2016/000205, dated Sep. 13, 2016.
Chinese Office Action in Chinese Application No. 201680027149.6 dated Jul. 3, 2019 with English Translation.

*Primary Examiner* — William H. Mayo, III
*Assistant Examiner* — Rhadames Alonzo Miller
(74) *Attorney, Agent, or Firm* — Collard & Roe, P.C.

(57) ABSTRACT

A high-voltage device for receiving a high-voltage cable having a conductor designed to conduct an electrical current and a cable insulation surrounding the conductor, includes an insulation and a waveguide. The insulation includes an at
(Continued)

least partly transparent or translucent field control unit from a siloxane polymer which is designed to at least partly surround the cable insulation of the high-voltage cable, the siloxane polymer including, in at least one portion of the field control unit, covalently bonded fluorophores and/or dielectric pigments. The waveguide is arranged such that a light signal caused by a partial discharge in the field control unit can be coupled from the field control unit into the waveguide.

16 Claims, 7 Drawing Sheets

(51) Int. Cl.

| | | |
|---|---|---|
| *G01R 31/12* | (2006.01) | |
| *H01B 3/46* | (2006.01) | |
| *H02G 1/14* | (2006.01) | |
| *H02G 15/064* | (2006.01) | |
| *H02G 15/068* | (2006.01) | |
| *H02G 15/184* | (2006.01) | |
| *H01B 9/00* | (2006.01) | |
| *H02G 15/00* | (2006.01) | |

(52) U.S. Cl.
CPC .............. *H02G 1/14* (2013.01); *H02G 15/02* (2013.01); *H02G 15/064* (2013.01); *H02G 15/068* (2013.01); *H02G 15/184* (2013.01); *H01B 9/006* (2013.01); *H02G 15/003* (2013.01)

(56) References Cited

U.S. PATENT DOCUMENTS

| | | | |
|---|---|---|---|
| 4,521,549 A | | 6/1985 | Penneck |
| 5,515,656 A | * | 5/1996 | Mihalich .................. B64F 1/12 248/156 |
| 6,426,150 B1 | | 7/2002 | Jenkner et al. |
| 6,810,847 B1 | * | 11/2004 | Jefferson ............ H01R 13/6485 123/169 E |
| 6,952,025 B2 | * | 10/2005 | Kamemura ............. H01L 33/46 257/98 |
| 7,055,482 B1 | * | 6/2006 | Jefferson ............ H01R 13/6485 123/169 E |
| 7,142,291 B2 | | 11/2006 | Sarkozi et al. |
| 7,154,036 B2 | * | 12/2006 | Lynch ..................... H02G 7/00 174/5 R |
| 7,668,412 B2 | | 2/2010 | Lee et al. |
| 2006/0003622 A1 | * | 1/2006 | Lynch ..................... H02G 7/00 439/404 |
| 2009/0102489 A1 | | 4/2009 | Lee et al. |
| 2010/0218988 A1 | * | 9/2010 | Lynch ..................... H02G 7/00 174/5 R |
| 2017/0062684 A1 | * | 3/2017 | Ikeda .................. H01L 25/0753 |

FOREIGN PATENT DOCUMENTS

| | | | |
|---|---|---|---|
| DE | 10 2010 061 607 A1 | 6/2012 | |
| DE | 10 2013 104 155 A1 | 11/2014 | |
| EP | 1 026 704 A2 | 8/2000 | |
| EP | 2 472 688 A2 | 7/2012 | |
| EP | 2472688 A2 * | 7/2012 | ......... G01D 5/35303 |

\* cited by examiner

SET OF HIGH-VOLTAGE CABLES AND METHOD FOR PRODUCING A SET OF HIGH-VOLTAGE CABLES

CROSS REFERENCE TO RELATED APPLICATIONS

This application is the National Stage of PCT/DE2016/000205 filed on May 10, 2016, which claims priority under 35 U.S.C. § 119 of German Application No. 10 2015 107 479.6 filed on May 12, 2015, the disclosures of which are incorporated by reference. The international application under PCT article 21(2) was not published in English.

The present invention relates to a high-voltage cable accessory, especially a cable junction box and a termination, as well as to an associated production method.

In electrical systems for energy supply, failures occur repeatedly due to damaging influences on the high-voltage accessory and aging phenomena of the polymeric insulations. These failures are caused mainly by partial discharges. However, such failures may also be caused or promoted by mounting errors, since, for example, tiny particles inadvertently introduced into the high-voltage accessory during the mounting may lead to extreme local field elevations during operation. During the partial discharges, so-called partial discharge trees, which grow in the course of the time and ultimately lead to an electrical breakdown, are formed in the insulating material if the concerned systems are not shut down in timely manner. Partial discharges in insulations of cable accessories, such as terminations and cable junction boxes for power cables or high-voltage cables, may therefore lead, in advanced stage, to total destruction (explosion) of the cable accessories and to network failures. Because of the high energy release associated with the breakdown, further parts of the systems may be damaged in the process. The damage caused by these events, which indeed are somewhat rare, can therefore be considerable.

According to conventional wisdom, a polymeric insulating material becomes altered in several stages in the high-voltage alternating field. The processes that lead to partial discharges in dielectrics under d.c. voltage load could take place similarly, but will not be described in detail in the following. In high-voltage alternating fields, a three-stage phenomenological aging model, which includes the partial-discharge process as the third stage, is typically assumed for polymeric insulations. In the first stage, a supply of charge carriers is developed that, depending on material and field distribution, is identified by a characteristic critical field strength. This process is able to proceed everywhere in the insulating-material volume that the critical field strength is exceeded, for example due to production-related inhomogeneities. However, it is also able to occur at the interface to the current-carrying conductor. The second stage of the model is characterized by the fact that, with the beginning of charge-carrier injection, an energy transfer takes place from the electric field via the injected charge carriers to the polymer matrix. In this process, material-dependent and production-related inhomogeneities have a central role, since they act as the starting points for the irreversible damaging mechanisms that are now beginning. Due to the injection of charge carriers into the respective half oscillations of the high-voltage alternating field, a buildup of space charges takes place at traps. In the process, electroluminescence phenomena may develop. The occurrence of electroluminescence in this phase may be caused by so-called "hot electron" processes, by excitation of molecules and by charge-carrier recombinations. Which if any of these processes dominates depends on the material. The energy transfer via the injected charge carriers leads to irreversible chemical, mechanical and thermal changes of the polymer microstructure. In the process, the local field-strength profile typically is strongly influenced by space-charge disturbances. Then it is possible for the formation of microcavities to occur, which may be accompanied by the emission of acoustic signals and in which partial discharges are triggered after exceedance of a critical magnitude, whereupon the third stage is reached. Due to electrochemical changes (reaction loss) and/or during the partial discharges, moreover, mechanical stresses may develop and as their consequence cracks and fissures form in the insulating material. In the further course of events, increasingly stronger partial discharges may occur, which may lead to growing partial-discharge trees and ultimately to undesired electrical breakdown as well as the mentioned serious consequential damage.

The detection of inhomogeneities or of consequences of aging processes in the insulating material with electrical or electromagnetic measuring methods is possible with sufficient sensitivity only after the development of the destruction structures (partial-discharge trees). Under practical conditions, electrical measurements are influenced by electromagnetic interferences, and in addition are technically very complex. Quantitative data on the degree of destruction are possible only to a limited extent or only at a very late stage. For this purpose, destruction structures frequently must have first reached a certain magnitude, i.e. the breakdown is directly imminent, measured in terms of the estimated useful life of the electrotechnical system of approximately 40 years. By then it may already be too late for an efficient repair of the component, for example within planned maintenance phases.

Partial discharges can be detected with fiber-optic methods. Thus U.S. Pat. No. 7,668,412 B2 describes a method and a distributed sensing system for detection of discharges and for monitoring of electrical lines. For this purpose an optical fiber with a silicon dioxide core of less than 500 micrometers in diameter and a cladding in which a luminescent material is integrated is disposed in the vicinity of objects to be investigated. A photodetector is positioned at a second end of the optical fiber and senses and measures both a direct emission light from an electrical partial-discharge event and the emission light reflected from a first reflecting end of the optical fiber. The measured signals and their arrival times are used to determine the location and the magnitude of an electrical partial discharge.

Moreover, German Patent DE 10 2010 061 607 A1 describes a method for monitoring of processes of aging of an insulation in a high-voltage device. The method comprises the measurement of a light signal generated in the insulation with a first fiber-optic sensor and the measurement of a mechanical variable of the insulation with a second fiber-optic sensor on the basis of fluorophore-doped optical fibers as well as the estimate of an aging condition of the insulation. Furthermore, DE 10 2010 061 607 A1 describes a high-voltage device with a transparent or translucent insulation and a fiber-optic sensor on the basis of fluorophore-doped optical fibers and a second fiber-optic sensor for detection of deformations.

However, the sensitivity of fiber-optic systems that heretofore were usable in high-voltage equipment during operation is often not sufficient to reliably detect, in particular, partial discharges preceding damage to the insulation of high-voltage equipment by electrons in the energy range of only a few to a few times ten electron volts (eV), which lead to electroluminescence. In optical fibers with a core doped with fluorophores, the fluorophores are not covalently bound but instead are physically dissolved. Because they are able to migrate already at room temperatures and even at low temperatures, the scope of use of such FOFs is limited. In addition to this, a person skilled in the art considers the introduction of organic dyes into the insulation of high-voltage accessories as critical, because they act as contamination, can be easily polarized electrically and thus may represent nuclei for the tree growth, which ultimately may lead to a breakdown.

In view of the foregoing, the present invention proposes a high-voltage cable accessory according to claim 1, a method according to claim 12 and a use according to claim 15.

According to one exemplary embodiment, a high-voltage cable accessory for the accommodation of a high-voltage cable with a conductor set up for the conduction of electrical current and a cable insulation surrounding the conductor is provided with an insulation and a waveguide. The insulation has a field-control part, which is transparent or translucent at least in some regions, and which comprises a siloxane polymer, typically a siloxane elastomer (elastomeric field-control part), more typically a silicone elastomer. In this connection, the siloxane polymer contains, at least in one partial zone of the field-control part, fluorophores, which are covalently coupled to the siloxane polymer and/or to dielectric pigments embedded in the siloxane polymer, and/or dielectric pigments. The field-control part is set up to surround the cable insulation of the high-voltage cable at least partly. The waveguide is arranged such that at least one light signal caused by a partial discharge in the field-control part can be coupled from the field-control part into the waveguide.

The high-voltage cable accessory is typically a cable junction box or a cable termination.

The term "high voltage" as used here is intended to include voltages above approximately 1 kV; in particular the term high voltage is intended to include the nominal voltage ranges, customary in energy transmission, of the medium voltage from approximately 3 kV to approximately 50 kV, of the high voltage from approximately 50 kV to approximately 110 kV and also extra-high voltages up to approximately 500 kV at present. For the case that the cable operating voltages will be further raised, it is intended that these voltage ranges will also be included. Both d.c. voltages and a.c. voltages can be meant in this connection. The term "high-voltage cable" as used here is intended to describe a cable that is suitable for conducting power current, i.e. electrical current of greater than approximately one ampere at voltages above approximately 1 kV. In the following, the terms high-voltage cable and power cable will be used synonymously. Accordingly, the term of the "high-voltage accessory" or "high-voltage cable accessory" is intended to describe an apparatus that is suitable for connecting high-voltage cables with high-voltage systems and/or high-voltage cables with high-voltage overhead lines and/or high-voltage cables with one another.

By the introduction of fluorophores and/or dielectric pigments into the siloxane polymer of the field-control part, on the one hand its electrical properties (conductivity and dielectric constant) are influenced not at all or only slightly, and so the field-control part continues to assure the desired profile of the electric field during operation, while on the other hand the fraction of light signals being created in the field-control part and coupled into the waveguide can be increased. Thereby partial discharges and even mounting-related defects preceding partial discharges and/or operation-related damage to the insulation by electrons in the energy range of only a few to a few times ten electron volts (eV), which lead to electroluminescence, can be detected highly sensitively and reliably.

The light signals coupled into the waveguide can be further transmitted to an optical detector, e.g. a photocell or a spectrometer in a control station. This permits a more certain early recognition (online monitoring) of damage to the insulation, an estimate of the useful life of the system installation and a long-range planning of the maintenance and repair of the system. Thereby the development of critical destruction structures, which initiate a breakdown, can be prevented by an efficiently plannable repair. In addition, the defect location in the system can be identified much more easily due to the optical sensing of the light signals generated in the insulation.

Accordingly, a high-voltage device is provided with a high-voltage cable accessory with a field-control part on the basis of a siloxane polymer, which contains fluorophores and/or dielectric pigments at least in a partial zone, wherein the fluorophores can be coupled covalently to the siloxane polymer and/or to the dielectric pigments embedded in the siloxane polymer, and a waveguide, which is disposed such that a light signal generated in the field-control part can be coupled from the field-control part into the waveguide, as well as with an optical detector, which is coupled with the waveguide of the high-voltage cable accessory. As an electrical supply network, the high-voltage device may have a multiplicity of such high-voltage cable accessories.

The high-voltage device further typically comprises, coupled with the optical detector, a control and evaluation unit, which typically forms a monitoring device for high-voltage cable accessory, and/or, connected to the control and evaluation unit, a light source, which is disposed inside a housing of the high-voltage cable accessory, typically in a region of low electrical field strength during the operation of the high-voltage cable accessory connected with one or two cables. The light source, e.g. an LED, can be used for the checking of the functional performance of the sensor formed by the waveguide and the optical detector for the light signals caused by damage processes in the insulation.

The optical radiation (light signal) emitted by the damage processes and to be detected can result both from electroluminescence (especially in regions of high electrical field strength in the field-control part) and photoluminescence processes, respectively in particular wavelength regions, and from partial-discharge processes in the developing discharge trees.

The term "partial discharge" as used here is intended to describe transient, relatively low-energy and locally limited discharges in the insulation that do not lead immediately to an electrical breakdown but damage the material of the insulation irreversibly. In particular, the term "partial discharge" is intended to include in particular the term of the "internal partial discharge", i.e. a discharge phenomenon, not necessarily visible externally, in non-gaseous insulating materials, especially in solid insulating materials such as polymers. Starting from defect sites, such as voids and foreign inclusions or interfaces to other materials, especially to conductors carrying high voltage, partial discharges may lead in the course of time to growing partial-discharge trees in the insulating material, which ultimately may lead to a breakdown. Partial discharge trees typically have a magnitude of more than approximately 1 μm (micrometer).

As a measure for the strength of a partial discharge, it is possible to use the apparent charge measurable directly at the test terminals of an electrical measuring arrangement. With established electrical and electromagnetic measuring methods, it is possible at present to detect partial discharges with an apparent charge of more than approximately 1 pC (pico coulomb) under the test conditions that are common in practice. The industry standard IEC 60840 Ed. 4, 2011 requires a measuring accuracy of approximately 5 pC for the testing of high-voltage cable systems. During the high-voltage operation of the high-voltage cable accessory, however, the measuring sensitivity of this method is limited by electromagnetic basic interference level to a range of approximately 20 pC to approximately 50 pC. The term "partial discharge" as used here is intended in particular to include discharges in the insulation with apparent charges, i.e. electrically measurable apparent charges, of greater than approximately 1 pC.

The waveguide may be disposed in the field-control part and/or on a surface of the field-control part.

The waveguide is typically an optical fiber and more typically a polymeric optical fiber (POF), which may consist of the siloxane polymer of the field-control part or of another siloxane polymer. Thereby field distortions due to the waveguide are very largely avoided in the field-control part.

Moreover, the optical fiber may have a fluorescent fiber core, at least in a fiber portion that is disposed on the or in the field-control part. This permits a particularly efficient coupling of light from the field-control part into the optical fibers and a low-loss further transmission of the coupled light.

Furthermore, the waveguide may also be modified in its cladding and/or in its core with covalently bound fluorophores.

The fluorophores of the field-control part are typically selected such that they can convert the light signal caused by damage processes into radiation of a wavelength region in which the siloxane polymer has a higher transparency than in the wavelength region of the original (primary) light signal. Thereby the absorption losses in the field-control part are reduced and thus the detection sensitivity is increased. For example, the fluorophores of the field-control part are excited in a wavelength region below 500 nm, e.g. in the UV region, and, depending on their Stokes shift, re-emit longer-wave light, which is absorbed more weakly by the siloxane polymer. As fluorophores, it is possible, for example, to use naphthalimide dyes, which, via corresponding reactive groups, can be covalently bound with the polymer network, typically a silicone-elastomer network.

Besides the reactive groups for crosslinking, the silicones usually also contain siloxane repeating units (—O—Si(R)(R')—O—, $SiO_2R_2$) of dimethyl- (R=R'=methyl=$CH_3$), methylphenyl- (R=methyl=$CH_3$, R'=phenyl=$C_6H_5$) or diphenylsiloxane (R=R'=phenyl=$C_6H_5$) or combinations of these constituents. Fluorophores may be covalently bound to monomeric siloxane units or else also to crosslinkable oligomeric siloxanes. However, other moieties, such as condensed aromatics, fluorinated hydrocarbons or aliphatic hydrocarbons, to which fluorophores can be covalently bound, are also possible.

The proportion by mass of the covalently bound fluorophores in the partial zone of the field-control part or in the entire field-control part relative to the siloxane typically amounts to at least 5 ppmw, depending on the absorption cross sections, and may be as high as approximately 500 ppmw (where ppmw is the English abbreviation for "parts per million by weight", which corresponds to $10^6 \times$mass of fluorophore/mass of siloxane). This permits a sufficiently good conversion and subsequent further transmission of the light signal caused in the field-control part by damage processes.

In order to achieve particularly sharp separation between absorption and emission bands, whereby the reabsorption within the doped volume of the field-control part can be further reduced, the siloxane polymer may be modified with various covalently bound fluorophores, which act as FRET pairs (Förster resonance energy transfer pairs). Thus a silicone polymer may be doped with naphthalene and dansyl, naphthalimide and diethylaminocoumarin, or fluorescein and rhodamine. For this purpose, respectively two molecules of the FRET pair, before the covalent binding to the siloxane network, are bound by suitable synthesis steps to a common carrier molecule (which is passive optically and also with respect to the electron systems of the fluorophore molecule) in such a way that their spatial spacing is limited permanently to a value within the FRET radius of approximately 30 to 70 angstrom.

The fluorophores are typically covalently coupled to the siloxane polymer or to dielectric particles that are embedded in the siloxane polymer and in turn can be covalently bound to the siloxane polymer. The dielectric particles may be functionalized particles, typically nanoparticles. As an example, silicone dioxide particles surface-functionalized with hydridosiloxane or polyorganosiloxane particles with unsaturated functionalities (e.g. hydrido groups or unsaturated hydrocarbon groups such as allyl and vinyl groups) may be used as dielectric particles.

Due to a covalent coupling of the fluorophores, the diffusion of the fluorophores in the siloxane polymer is prevented. This makes it possible, during the anticipated lifetime of up to several decades, to confine the fluorophores to the partial zone, e.g. in partial zones particularly susceptible to damage or in partial zones functioning as optical-waveguide regions.

The field-control part typically occupies that space in the high-voltage accessory in which the field strength during high-voltage operation is too high for the other insulation.

The field-control part, which is also known as field-control unit, typically has, for variation of the electric field profile in the high-voltage accessory, a conductive deflector, which can be contacted with a cable shielding of the high-voltage cable. In particular, the field-control part may be formed as a field-control cone with an integrated conductive deflector.

By means of the deflector, the field-control part is able to guide the field lines during high-voltage operation of the high-voltage cable accessory in such a way that the field strength outside the field-control part is sufficiently low. By means of embedded graphite or carbon-black particles, the conductive deflector can have a high absorption coefficient in the expected wavelength region of the electroluminescence phenomenon and/or partial-discharge phenomenon, and then it represents a substantially opaque or strongly absorbing part of the field-control part.

The deflector may consist of the siloxane polymer of the remaining part of the field-control part or of another siloxane polymer. The siloxane polymer of the deflector may also be modified with covalently bound fluorophores and/or may contain dielectric pigments, for example in the region bordering the remaining part of the field-control part. Thereby a part of the light signal can be prevented from penetration into the more strongly absorbing deflector.

According to one improvement, the field-control part has several partial zones that are disjunct or even spaced apart from one another and that contain fluorophores and/or dielectric pigments. Thus a particularly high fraction of the light signal caused by or accompanying damage processes in the field-control part can be coupled into the waveguide. For example, the primary light signal, caused by or accompanying damage processes in the field-control part, can be converted in a first partial zone by the fluorophores thereof into a longer-wave secondary light signal, which is reflected by the pigments of a second partial zone and thereby is prevented at least partly from penetration into the absorbing deflector, is prevented from exiting the field-control part in the direction of a non-polymeric further insulation zone and/or is deflected at least in parts in the direction of the waveguide.

The field-control part may have several partial zones containing fluorophores and/or several partial zones containing pigments, or else only one partial zone containing fluorophores or only one partial zone containing pigments. Partial zone(s) are typically three-dimensional zones. If the concentration of the fluorophores or pigments in the partial zone(s) is very high, these may also be very thin, for example an area that in practice is typically curved in comparison with the dimensions of the field-control part (i.e. a thin layer with large surface-to-volume ratio), which area may be disposed close to a surface of the field-control part and/or represents a part of the surface. This may be of interest, e.g. for partial zone(s) containing only pigments, since in this way a good backscattering of the light into the rest of the volume of the field-control part or to the waveguide can also be ensured and, in addition, influences on the electric field profile can be practically excluded, since the fields close to the outer surface of the field-control part are comparatively weak.

The reflectivity of the dielectric pigments is typically greater than 0.8 and more typically greater than 0.9, in order to reflect as much light as possible in desired directions. Therefore the dielectric pigments are typically white. In particular, particles of $TiO_2$, $ZnO$, $SnO$ or $Al_2O_3$ or dielectric particles with coatings of these materials are used as dielectric pigments.

The concentration of the dielectric pigments in the partial zone is typically higher than 1% by vol, more typically higher than 2% by vol and even more typically higher than 5% by vol. Thereby a sufficiently high fraction of the light can be reflected.

The shape and arrangement of the partial zone or of the partial zones and of the waveguide or of the waveguides are typically matched to one another, in order to achieve particularly good light transmission and therefore high measuring sensitivity.

According to one exemplary embodiment, a method for the production of a high-voltage cable accessory for the accommodation of a high-voltage cable with a conductor set up for the conduction of electrical current and a cable insulation surrounding the conductor comprises the following steps:

formation of a field-control part, which is transparent or translucent at least in some regions, and which is based on a siloxane polymer, typically a siloxane elastomer;

arrangement of the field-control part in a housing of the high-voltage cable accessory, so that the field-control part is able to surround the cable insulation of the high-voltage cable at least partly; and;

arrangement of a waveguide in the housing.

The method is carried out in such a way that the siloxane polymer contains fluorophores and/or dielectric pigments at least in one partial zone of the field-control part and such that at least one light signal caused by a partial discharge in the field-control part can be coupled from the field-control part into the waveguide.

The formation of the field-control part typically comprises the mixing of the crosslinkable components of a siloxane system, which often has two components, with the fluorophores functionalized for crosslinking, with fluorophores bound to dielectric particles and/or with the dielectric pigments for formation of a mixture, the introduction of the mixture into the mold and the polymerization of the mixture in the mold.

Since the field-control part to be produced typically contains zones that are free of covalently bound fluorophores and dielectric pigments or at most have been slightly modified therewith, siloxane without fluorophores and dielectric pigments is also typically introduced into the mold.

The process may also be carried out iteratively, depending on arrangement and shape of the partial zone or zones. This means that the field-control part comprises several cycles of the introduction of the mixture or of the siloxane and of the subsequent polymerization of the mixture in the mold.

Alternatively or additionally, the dielectric pigments may be applied on a surface or a surface portion of the mold before the introduction of the mixture, or as a coating after removal of the polymerized siloxane from the mold, e.g. by application of a white silicone-resin dye, i.e. a dye based on silicone resin and containing white dielectric particles, such as $TiO_2$.

Prior to the polymerization (in one cycle), a portion of the waveguide may be introduced into the mold.

However, the waveguide may also be applied only on one surface of the field-control part after its forming in the mold, e.g. bonded with and/or on the surface by means of a silicone adhesive. In addition, the applied waveguide may then be provided with a siloxane-based reflecting layer, e.g. by application of an appropriate silicone-resin dye. Thereby light losses may be further reduced. These steps may also be carried out in place.

It is even possible to slip the covalently modified partial zone as an outer ring onto a control part and to bond it adhesively there if necessary. This may also be performed in place, and so even existing high-voltage equipment may be retrofitted, for example during a maintenance.

According to one exemplary embodiment, a siloxane polymer containing fluorophores and/or dielectric pigments is used as insulation of a high-voltage device.

Via at least one waveguide optically coupled with the insulation and an optical detector coupled with the at least one waveguide, damage or aging processes of the insulation can be monitored highly sensitively and reliably.

The high-voltage device is typically a high-voltage cable accessory, especially a cable junction box or a cable termination, the field-control part of which typically contains partial zones of the siloxane polymer containing fluorophores and/or dielectric pigments.

However, the siloxane polymer modified with covalently bound fluorophores and/or dielectric pigments may also be used as insulation in other high-voltage devices, such as voltage converters (transformers) and switching systems.

According to one exemplary embodiment, a high-voltage device comprises an insulation, which is transparent or translucent at least in some regions and which is based on a siloxane polymer, wherein the siloxane polymer contains fluorophores and/or dielectric pigments at least in one partial zone of the insulation, and a waveguide, which is disposed such that at least one light signal caused by a partial discharge in the insulation can be coupled from the insulation into the waveguide.

Further advantageous configurations, details, aspects and features of the present invention will become apparent from the dependent claims, the description and the attached drawings, wherein:

Figure 1:
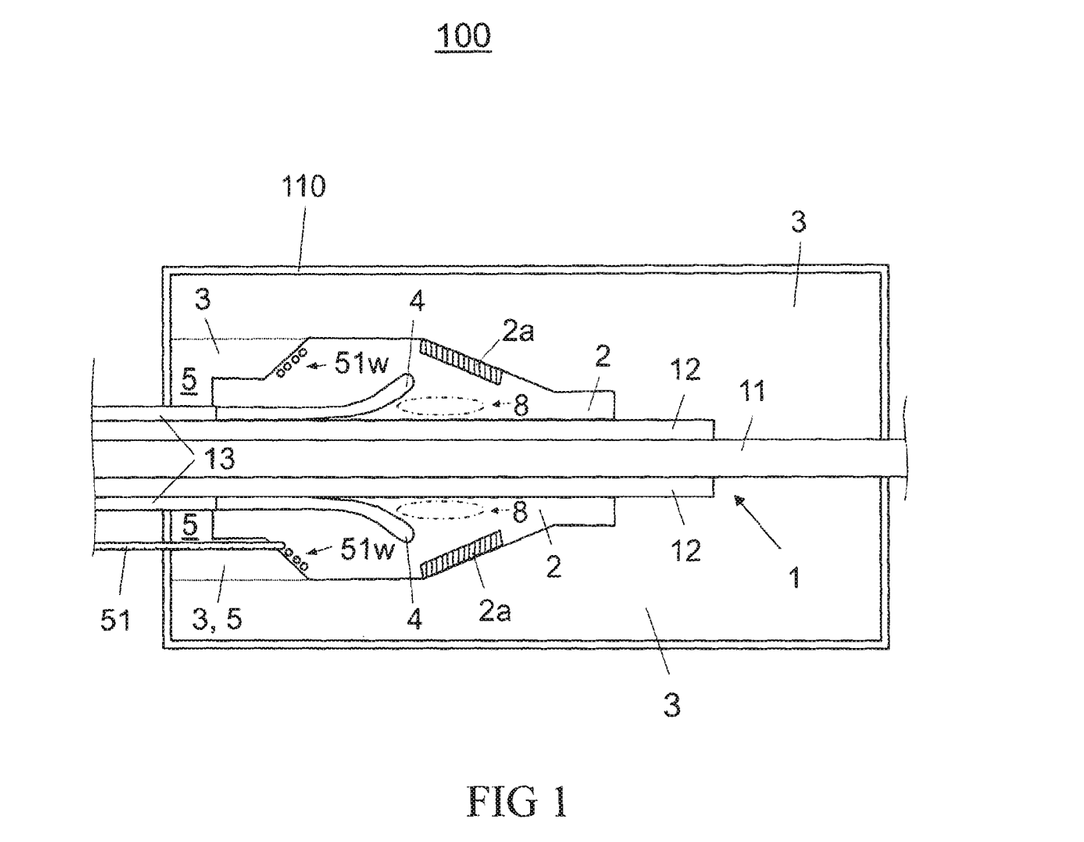
FIG. 1 shows a schematic cross section of a high-voltage accessory according to one exemplary embodiment.

FIG. 1 shows a high-voltage accessory 100 for accommodation of a high-voltage cable 1 according to one exemplary embodiment in a schematic central cross-sectional view along the cylinder axis of the high-voltage cable 1. The rotationally symmetric high-voltage cable 1 contains, in the interior, a conductor 11 for conduction of power current, for example an aluminum or copper conductor, which is surrounded by a cable insulation 12, typically an XLPE insulation (crosslinked polyethylene), and an outer cable shielding 13, e.g. an outer conductive layer or a semiconductive outer cable shielding. Furthermore, the high-voltage cable 1 may additionally have bedding layers and a copper shielding and an outer cladding for protection against environmental influences. This may be a polyethylene cladding or a cladding of another halogen-free material. For reasons of clarity, these components are not illustrated in FIG. 1 and the following figures. Moreover, the high-voltage cable 1 may have an inner conductive layer between the conductor 11 and the XLPE insulation. This inner conductive layer is likewise not illustrated.

The high-voltage accessory 100 illustrated in FIG. 1 represents a cable termination 100, such as is used for overhead lines, for example. The cable termination 100 has a housing 110, e.g. a ceramic housing, which seals off the inner parts of the high-voltage accessory 100 from the environment. The housing 110 typically encloses (except for apertures, for example for the high-voltage cable 1) an inner space that is axially symmetric, e.g. cylindrically symmetric, in cross section. An insulation zone 3 is disposed in the interior (inner space) of the housing 110. The insulation zone 3 may be formed, for example, by a largely transparent insulation space filled with oil or gas.

On the high-voltage cable 1 introduced into the cable termination 100, the outer layers (cable cladding, bedding layers and metallic shielding) are removed, the typically semiconductive outer cable shielding 13 is routed further into the region of the field-control part and thereafter only the cable insulation 12 with the conductor 11 is routed still further axially through the termination up to the head fitting. Only the conductor 11 is routed completely through the cable termination 100, in order to be connected in the region of the right side of FIG. 1, after exiting the cable termination 100, to the overhead line. In the interior of the cable termination 100, the conductor 11 is directly surrounded by the insulation zone 2 only in the region of the removed cable insulation. For accommodation of the high-voltage cable 1, a rotationally symmetric electrically insulating field-control part 2, which occupies that part of the inner space in which the electric field strength would be too large for the insulating materials in the insulation zone 3, is inserted into the inner space of the housing 110. The field-control part 2 is provided with an inner hollow cylinder, into which the high-voltage cable 1 can be inserted. For example, the field-control part 2 may be constructed as a field-control cone.

The field-control part 2 is typically an elastomeric field-control part, which consists of a transparent or translucent elastomeric member at least in some regions, e.g. of a silicone-elastomer member with sufficiently high transparency at one or more wavelengths in a range from approximately 300 nm to approximately 900 nm. The inner hollow cylinder is typically dimensioned such that a press fit exists between the cable insulation 12 of the inserted cable 1 and the field-control part 2, and so the field-control part 2 forms a stress cone. The non-polymeric insulation zone 3 and the field-control part 2 together form the insulation 2, 3 of the cable termination 100.

The field-control part 2 and/or the high-voltage cable 1 may be additionally fixed, for example via springs, to the housing 110 or in a region 5 of the insulation zone 3 that is close to the cable and is at ground potential (at least almost field-free), e.g. when the insulation zone 3 is formed by a solid insulating member. Such a fixation of field-control part 2 and/or high-voltage cable 1 is typically used for a structure of the cable termination 100 in component construction. Regardless of the construction used, the insulation 2, 3 comprises a field-control part 2 for accommodation of the cable 1 with partly removed cable insulation 12 and for appropriate guidance of the field lines during high-voltage operation. In contrast, a cable junction box, not illustrated, is provided with two field-control parts for accommodation of respectively one of two cables to be joined with partly removed cable insulation and for appropriate guidance of the field lines during high-voltage operation of the high-voltage cable accessory.

An elastomeric field-control part 2, in which an appropriately shaped conductive deflector 4 is integrated, is typically used for degradation of the electric field. The conductive deflector 4 is in electrical contact with the cable shielding 13. The conductive deflector 4 typically also consists of a silicone elastomer which, however, is provided with an appropriate electrical conductivity by doping, e.g. with carbon.

Due to material inhomogeneities or defects, regions 8 of increased field strength typically occur in the field-control part 2 during operation. The probability of the occurrence of damage or the initiation of partial discharges and thus the generation of light signals is increased in the regions 8 with increased field strength.

In the exemplary embodiment illustrated in FIG. 1, a waveguide 51 in the inner space of the high-voltage accessory 100 leads into the field-control part 2, wherein it forms several turns 51w close to the surface of the field-control part 2. Thus the waveguide 51 is partly embedded in the field-control part 2. Since the waveguide 51 is disposed in a zone of low field strengths during operation (shielded from region 8 by the deflector), any moderate differences that may exist between the effective dielectric constant of the waveguide 51 and the dielectric constant of the material of the field-control part 2 (siloxane) have only a small influence on the field profile during high-voltage operation.

Due to the turns 51W, which have the shape of coils or spiral helixes, the probability may be increased of the coupling, into the waveguide 51, of a primary light signal accompanying a process of alteration (damage process) induced by a high-voltage field and mediated by charge carriers in the field-control part 2. Thus the probability of detection of the damage process by means of an optical detector coupled with the waveguide may also be increased.

The probability of detection of the damage process may also be increased by the hollow frustoconical partial zone 2a of the field-control part 2 in the exemplary embodiment, since silicone elastomer of the field-control part 2 is modified in partial zone 2a with covalently bound fluorophores, which convert a primary light signal generated most probably in the region 8 into a longer-wave secondary light signal, which is less strongly absorbed. Moreover, the undirected emission of the photons from the fluorophores also leads to a decrease of the fraction of the light that exits the field-control part 2 into the insulation zone 3.

The waveguide 51 is typically a fluorescent optical light-guiding fiber (FOF for the English "fluorescent optical fiber"), more typically a polymeric fluorescent optical light-guiding fiber ("fluorescent polymer optical fiber" in English) with doped core. The absorption wave spectrum of the fluorophore is typically matched to the expected spectrum of the light signals in the field-control part 2. Thus an extremely sensitive sensor for the light signals can be obtained. In particular, it may be provided that the core of the FOF contains both fluorophores with an absorption spectrum matched to the primary light signal and fluorophores with an absorption spectrum matched to an emission spectrum of the fluorophores of the partial zone 2a (multiple-doped core of the FOF).

For example, the fluorophores of the partial zone 2a are able to absorb light in a partial region of the wavelength range from 280 nm to 500 nm, typically from 315 nm to 500 nm and more typically from 350 nm to 500 nm and to emit longer-wave (secondary) light in the wavelength region above 500 nm, e.g. in the range from 500 nm to 800 nm, typically in a partial region thereof, in which the fluorophores of the core of the FOF absorb. This emission spectrum of the fluorophores of the partial zone 2a typically has a large overlap with the absorption spectrum of the fluorophores of the core of the FOF. It is also possible to use several fluorophores and to generate an energy gradient. Furthermore, the use of appropriately geometrically fixed fluorescent dye pairs, which permit a radiationless and thus loss-free energy transfer (FRET pairs), is possible.

If the effective dielectric constant of the optical fiber 51 deviates from that of the field-control part 2, a change may occur in the electric field distribution in the insulation. Then it may be additionally provided that the shape and/or conductivity of the field-control part 2, especially of the deflector, be modified such that the change of the electric field is compensated by the optical fiber 51. However, a change of the electric field distribution may also be at least largely avoided when the optical fiber 51 is also based on a siloxane.

The fluorescent optical fiber 51, together with an optical detector, not illustrated, typically forms a so-called "FOF sensor", i.e. such that the detector is matched to an emission wave spectrum of the fluorophore (or of the fluorophores) of the doped core. Both cladding and core of the optical fiber may also be modified with covalently bound fluorophores.

At least one end of the fluorescent optical fiber 51 is connected to the optical detector (optically coupled). However, both ends of the fluorescent optical fiber 51 may also be connected to the optical detector. Thereby a particularly high measuring sensitivity can be achieved. The optical detector is typically an opto-electric converter, e.g. a photodiode, for example an avalanche photodiode, or else a photomultiplier or even a spectrometer.

The optical detector and an evaluation unit connected thereto (also not illustrated) are typically disposed in a field-free space 5 or outside the termination housing 110. Thus detector and evaluation unit can be largely protected from electromagnetic interferences of the high-voltage field. The evaluation unit may even be a control and evaluation unit.

The fluorescent optical fiber 51 may be routed directly to the evaluation unit. However, it is also possible to connect the fluorescent optical fiber 51 to the evaluation unit via a transport optical fiber with smaller attenuation.

Moreover, it is also possible to embed, in the field-control part, not only one fluorescent optical fiber 51 with a matched absorption wavelength region but also several with various absorption wavelength regions. Thereby a broader section from the emission spectrum of partial discharges and/or electroluminescence can be sensed highly sensitively. Each of these fluorescent optical fibers may be connected via a transport optical fiber of its own to an individual detector, e.g. an individual photodiode adapted to the respective fluorophore. The signals of the individual photodiodes may then be simply added, for example, in order to determine an integral measure of the light output.

Because of its doping, the conductive deflector 4 may be opaque. In this case the deflector, as is obvious from FIG. 1, optically shades the fluorescent optical fiber 51 at least partly from the region 8 with increased field strength. Nevertheless, by virtue of the fluorescence-doped partial zone 2a, primary light signals emerging from the region 8 can be detected via secondary light signals.

Alternatively to this, the partial zone 2a may also be doped with pigments, e.g. titanium oxide particles, which reflect the primary light signals well, instead of with the fluorophores. In this way it is also possible to compensate, at least partly, for the shading effect of an opaque or strongly absorbing deflector 4.

It may even be provided that the partial zone 2a has a fluorescence-doped inner part (inner ring; because of the axial symmetry, the partial zone is typically substantially annular) and a pigment-doped outer part (outer ring). With this arrangement, particularly high light output from the field-control part can be coupled into the optical fiber 51.

Figure 2:
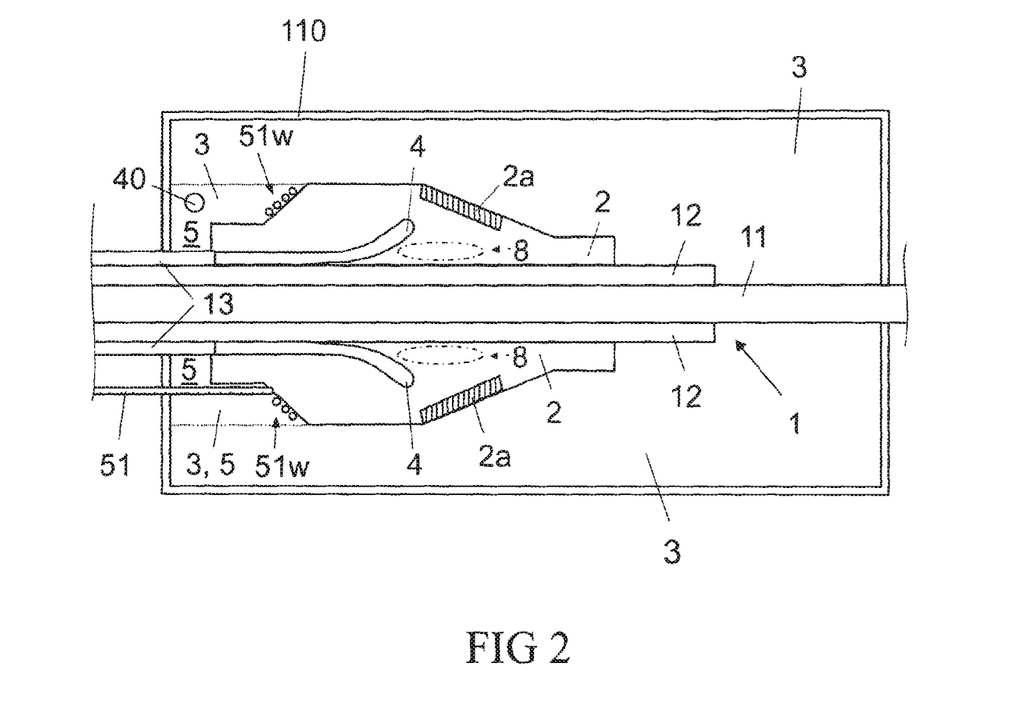
FIG. 2 shows a schematic cross section of a high-voltage accessory according to one exemplary embodiment.

FIG. 2 shows a high-voltage accessory 200 for accommodation of a high-voltage cable 1 according to one exemplary embodiment in a schematic central cross-sectional view along the cylinder axis of the high-voltage cable 1. The high-voltage accessory 200 is similar to the high-voltage accessory 100 explained with reference to FIG. 1 and likewise represents a cable termination. However, the optical fiber 51 of the cable termination 200 is not embedded in the field-control part 2 but instead is disposed on its outer surface, e.g. adhesively bonded with it. Aging processes caused by high-voltage fields can also be detected highly sensitively with this arrangement.

Moreover, a light source 40, e.g. an LED, which is connected to the control and evaluation unit and can be used by this for the checking and/or calibration of the fiber-optic sensor, is disposed in the field-free space 5.

Figure 3:
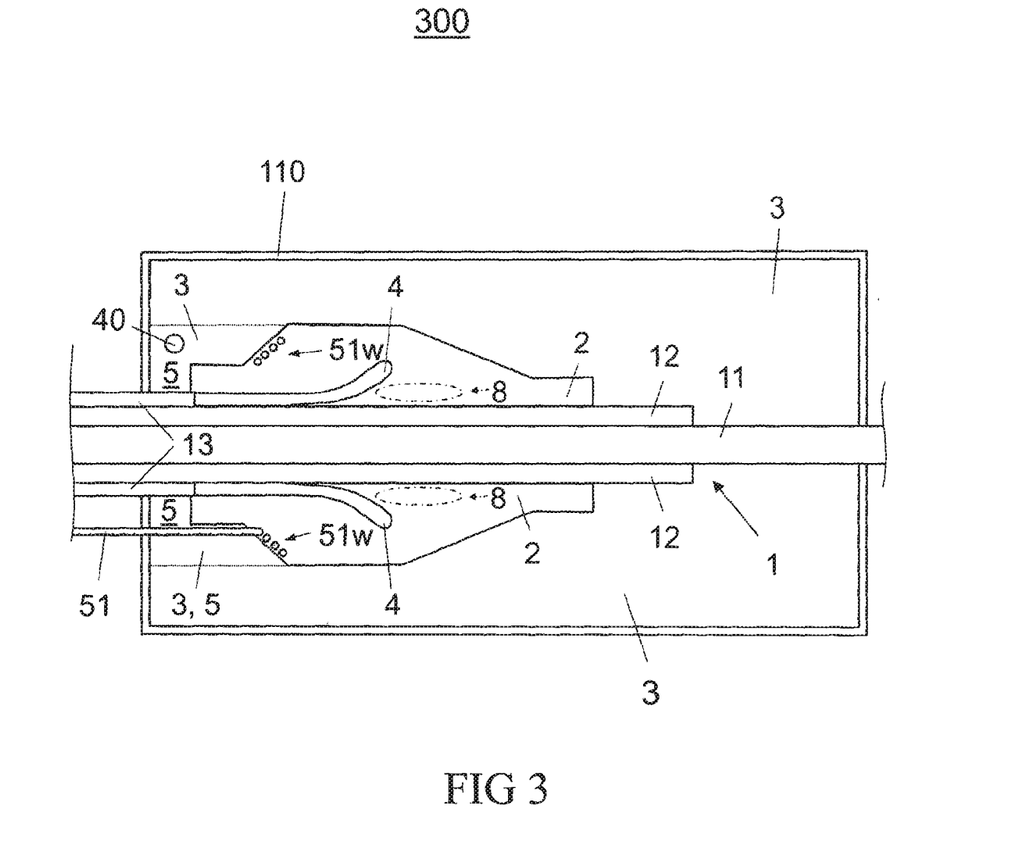
FIG. 3 shows a schematic cross section of a high-voltage accessory according to yet another exemplary embodiment.

FIG. 3 shows a high-voltage accessory 300 for accommodation of a high-voltage cable 1 according to one exemplary embodiment in a schematic central cross-sectional view along the cylinder axis of the high-voltage cable 1. The high-voltage accessory 300 is similar to the high-voltage accessory 100 explained with reference to FIG. 1 and likewise represents a cable termination. However, the field-control part 2 of the cable termination 300 consists, with the exception of the detector 4, of a siloxane elastomer doped with fluorophores, e.g. of a silicone elastomer doped with fluorophores. The field-control part 2 of the cable termination 300 can be produced relatively simply, since, aside from the deflector 4, only one siloxane doped with fluorophores is needed.

Moreover, the region 8 with increased field strength is also doped with fluorophores in this exemplary embodiment. Therefore the primary light signals generated in the region 8 of the highest danger of field-induced aging processes can be converted efficiently into longer-wave secondary light signals and the measuring sensitivity can be increased by virtue of the small absorption losses of the secondary light signals.

Figure 4:
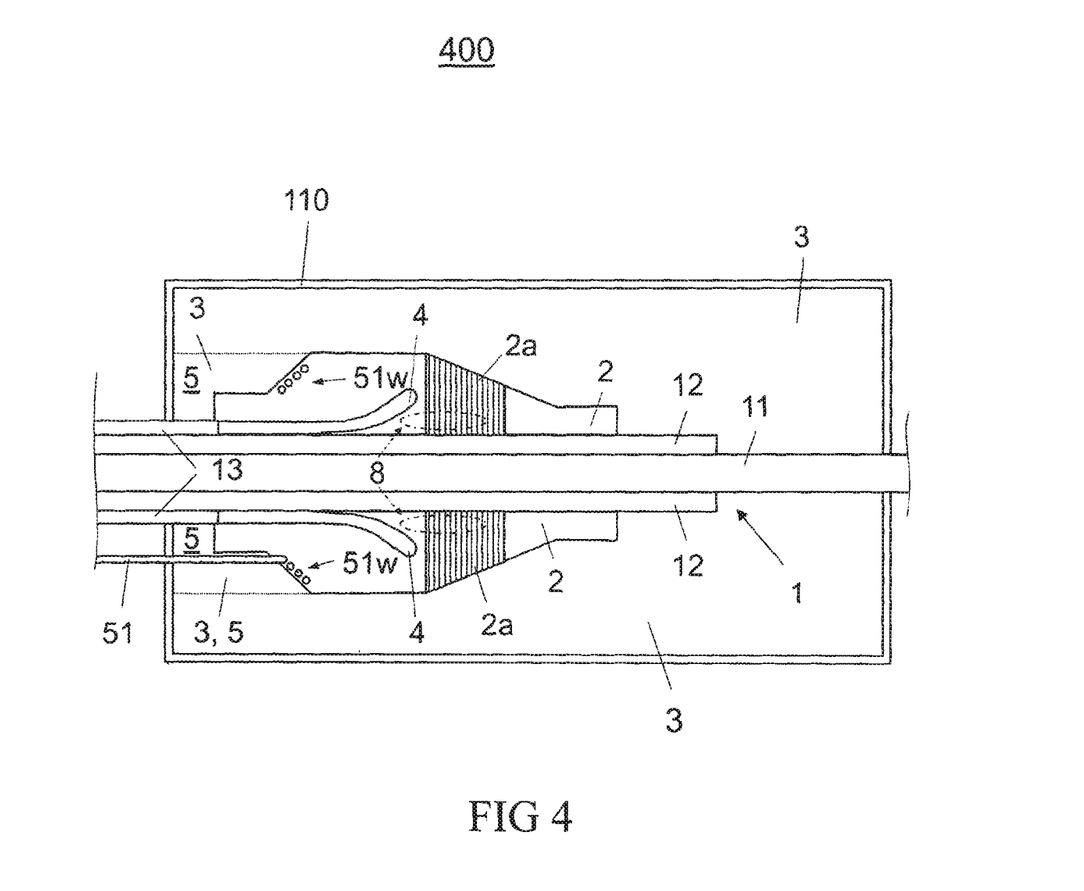
FIG. 4 shows a schematic cross section of a high-voltage accessory according to one exemplary embodiment.

This is also largely true for the cable termination 400, which is shown in FIG. 4 in a schematic central cross-sectional view along the cylinder axis of the high-voltage cable 1, and the field-control part 2 of which has a hollow conical partial zone 2a, which is doped with fluorophores and contains the region 8 of the highest danger of field-induced aging processes for the most part.

Alternatively to the geometry illustrated in FIG. 4, the partial zone 2a includes the region 8 partly or completely and it may have hollow cylindrical shape and, for example, extend up to or close to the cable insulation 12.

Figure 5:
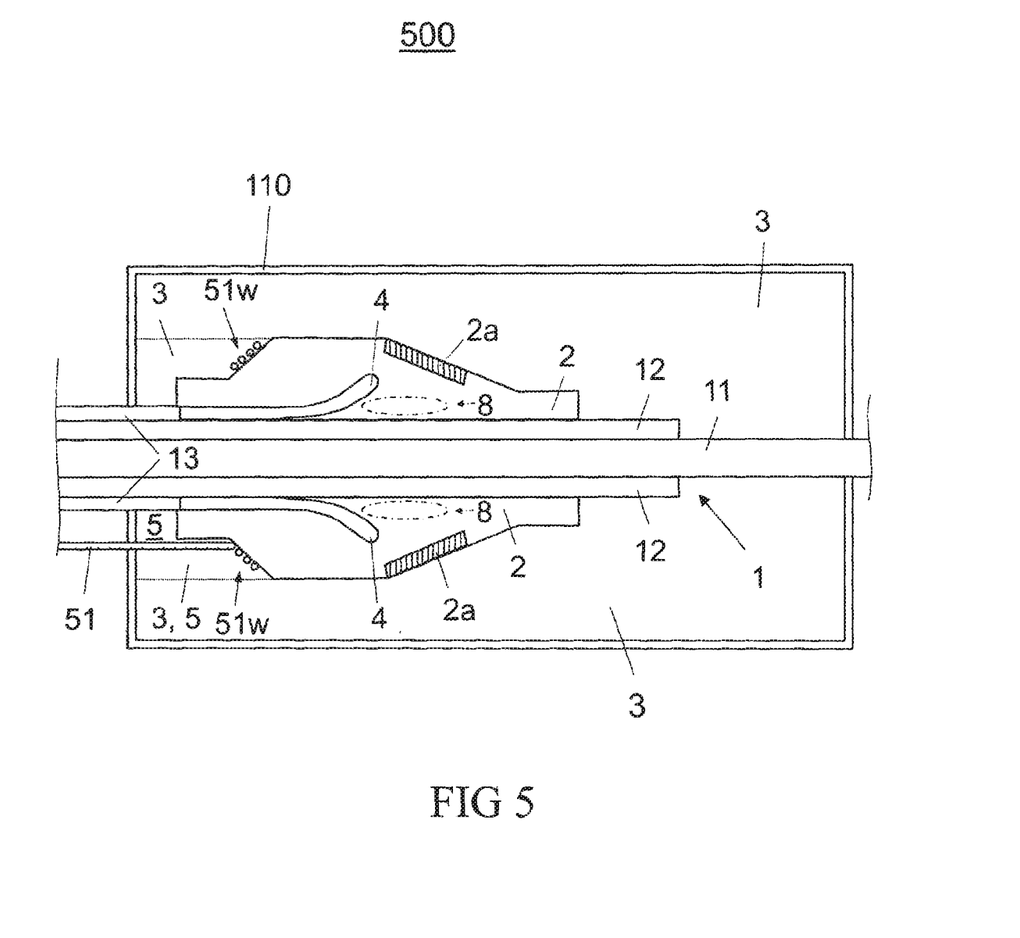
FIG. 5 shows a schematic cross section of a high-voltage accessory according to one exemplary embodiment.

FIG. 5 shows a high-voltage accessory 500 for accommodation of a high-voltage cable 1 according to one exemplary embodiment in a schematic central cross-sectional view along the cylinder axis of the high-voltage cable 1. The high-voltage accessory 500 is similar to the high-voltage accessory 100 explained with reference to FIG. 1 and likewise represents a cable termination. However, the partial zone 2a of the field-control part 2 of the cable termination 500 is doped not with fluorophores but instead with dielectric pigments. Due to the reflection of the primary light signals emerging in particular from the region 8 at the dielectric pigments of the partial zone 2a, the fraction of the primary light signal coupled into the optical fiber 51 can be increased. In this embodiment, the partial zone 2a forms a reflecting layer.

In the exemplary embodiment of FIG. 5, the optical fiber 51 is disposed only on the surface of the field-control part 2. This makes it possible to install or retrofit the optical fiber 51 in place. However, the optical fiber 51 of the cable termination 500 may also be embedded partly in the field-control part 2, as explained above with reference to FIG. 1. On the basis of the defined production conditions, a smaller fluctuation of the sensitivity for the measurement of field-induced aging processes may then be expected. When the optical fiber 51 is partly embedded in the field-control part 2, light losses can be additionally further reduced by a (further) partial zone of the field-control part 2, which contains dielectric pigments, acts as a reflecting layer and, viewed from the region 8, is disposed behind the turns 51w. These statements also apply analogously for the exemplary embodiments of FIGS. 3, 4.

Figure 6:
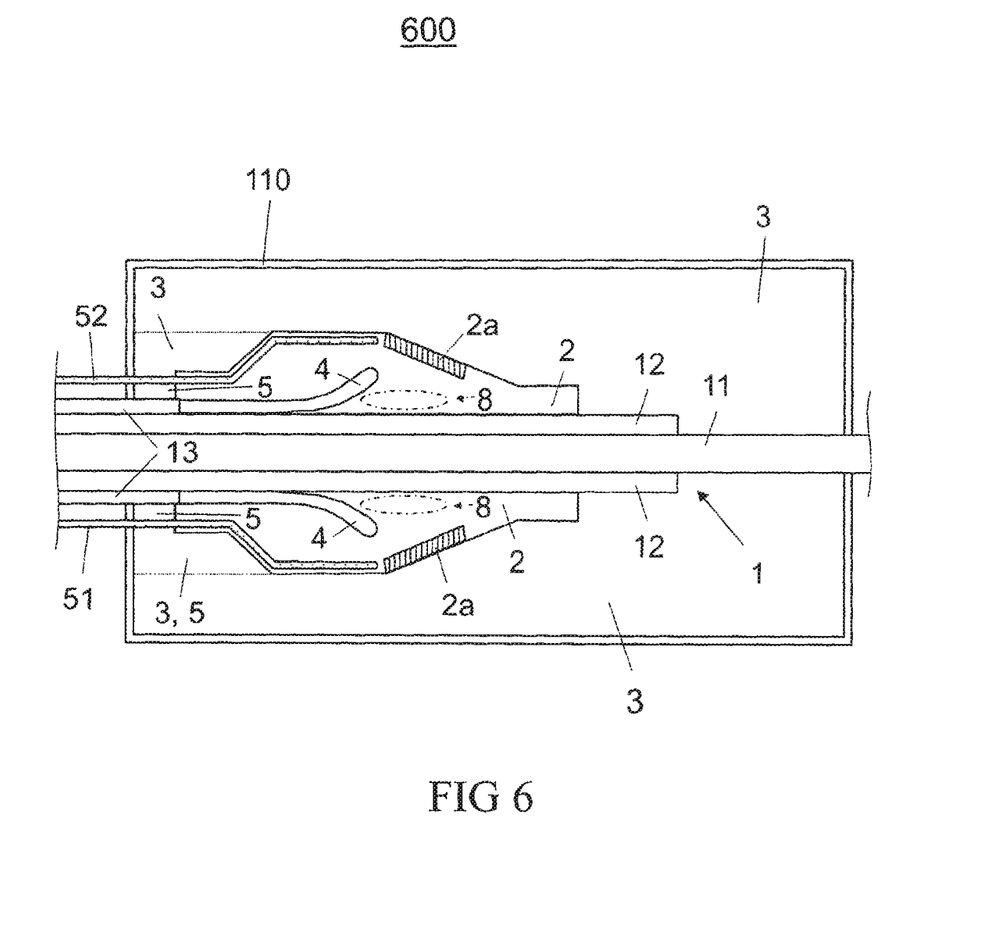
FIG. 6 shows a schematic cross section of a high-voltage accessory according to one exemplary embodiment.

FIG. 6 shows a high-voltage accessory 600 for accommodation of a high-voltage cable 1 according to one exemplary embodiment in a schematic central cross-sectional view along the cylinder axis of the high-voltage cable 1. The high-voltage accessory 600 is similar to the high-voltage accessory 100 and likewise represents a cable termination. However, two optical fibers 51, 52 (or even more than two optical fibers) are embedded and disposed circumferentially in the field-control part 2 of the cable termination 600. Moreover, the optical fibers 51, 52 are routed up to the partial zone 2a doped with fluorophores or at least up to close to the partial zone 2a. With this arrangement, it is possible to detect aging processes caused by high-voltage fields particularly sensitively via the light signals associated with them.

Figure 7:
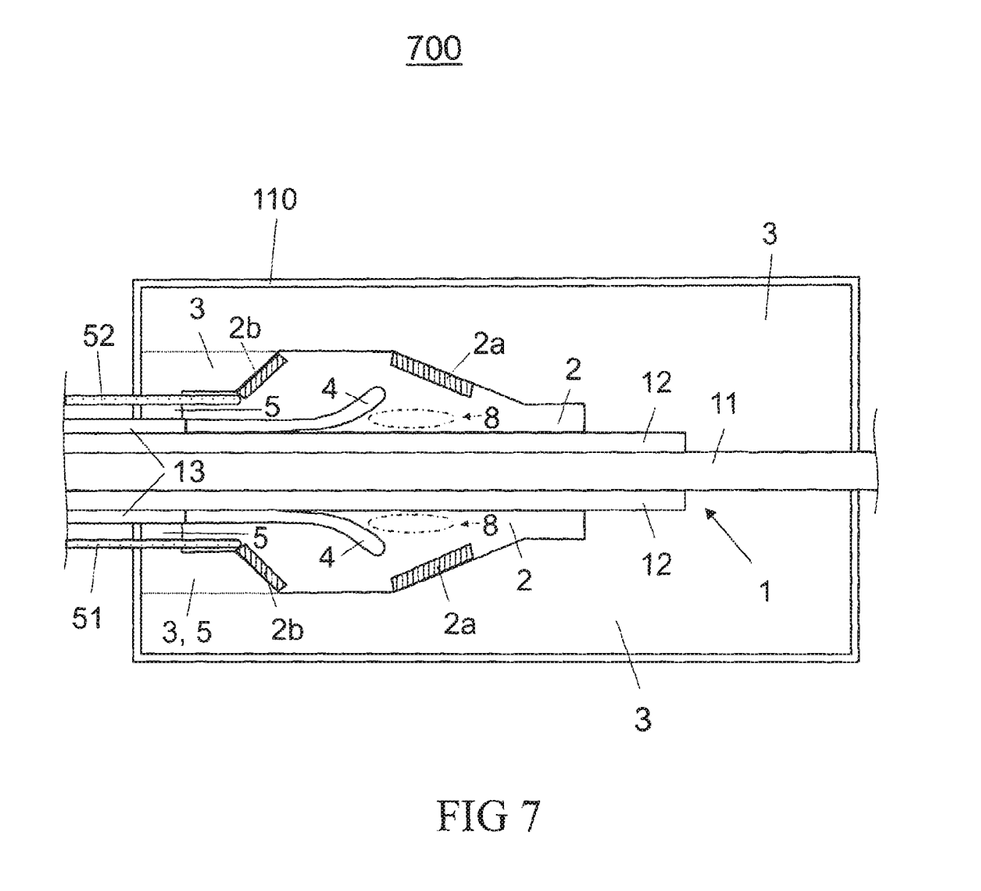
FIG. 7 shows a schematic cross section of a high-voltage accessory according to yet another exemplary embodiment.

FIG. 7 shows a high-voltage accessory 700 for accommodation of a high-voltage cable 1 according to one exemplary embodiment in a schematic central cross-sectional view along the cylinder axis of the high-voltage cable 1. The high-voltage accessory 700 is similar to the high-voltage accessory 600 explained with reference to FIG. 6 and likewise represents a cable termination. However, the optical fibers 51, 52 of the cable termination 700 are routed not up to the partial zone 2a but instead only up to a further partial zone 2b, which likewise is covalently modified with fluorophores.

Whereas the fluorophores of the partial zone 2a typically absorb light from a partial region of the wavelength range from 280 nm to 500 nm, more typically from 315 nm to 500 nm and even more typically from 350 nm to 500 nm and emit longer-wave (secondary) light in the wavelength region above 500 nm, e.g. in the range from 500 nm to 800 nm, typically in a partial region thereof, in which the fluorophores of the further partial zone 2a and if applicable also the fluorophores of the core of the optical fibers 51, 52 absorb strongly. This emission spectrum of the fluorophores of this partial zone 2a typically has a large overlap at least with the absorption spectrum of the fluorophores of the partial zone 2b.

Alternatively to this, the partial zone 2a of the cable termination 700 may also be formed as a reflecting partial zone, i.e. as a partial zone doped with dielectric pigments.

According to a further exemplary embodiment, not illustrated, several fluorescent optical fibers, for example four optical fibers, typically are constructed respectively as half loops and embedded in the field-control part together with a bus fiber, which functions as a "collector ring" and is doped with a further fluorophore. In this case it may be provided that the bus fiber is coated on the side facing away from the half loops with a white, reflecting layer, e.g. a layer containing $TiO_2$ particles or ZnO particles. Thereby the light-coupling efficiency can be further increased.

The high-voltage devices described here have an insulation, which is transparent or translucent at least in some regions and which is based on a siloxane polymer, typically based on a silicone elastomer, wherein the siloxane polymer contains fluorophores and/or dielectric pigments at least in one partial zone of the insulation, and a waveguide, typically an optical fiber with a fluorescence-doped fiber core, which is disposed such that a light signal generated in the insulation can be coupled from the insulation into the waveguide. The light signal generated in the insulation may be, for example, a partial-discharge flash or be caused by an electrically induced process of change of the insulation preceding the partial discharge, e.g. an electroluminescence signal.

In comparison with electromagnetic or piezoelectric sensors or measuring setups disposed outside the high-voltage device (accessory), the fiber-optic measurement permits a simpler and/or more sensitive and/or earlier detection of aging processes caused in the insulation by high-voltage fields. In combination with one or more partial zones of the insulation, which respectively are modified with covalently bound fluorophores and/or dielectric pigments, the detection sensitivity for aging processes caused in the insulation by high-voltage fields can be significantly further increased.

The invention claimed is:

1. A high-voltage cable accessory for the accommodation of a high-voltage cable with a conductor set up for the conduction of electrical current and a cable insulation surrounding the conductor, comprising:
an insulation comprising a field control part, which is transparent or translucent at least in some regions and which comprises a siloxane polymer, wherein the field-control part is set up to surround the cable insulation of the high-voltage cable at least partly, and wherein the siloxane polymer contains fluorophores at least in one partial zone of the field-control part, wherein the fluorophores are coupled covalently to the siloxane polymer and/or to dielectric pigments embedded in the siloxane polymer; and
a waveguide forming a part of the insulation is arranged such that a light signal caused by a partial discharge in the field-control part can be coupled from the field-control part into the waveguide.

2. The high-voltage cable accessory according to claim 1, wherein the waveguide is disposed at least partly in the field control part and/or at least partly on a surface of the field-control part.

3. The high-voltage cable accessory according to claim 1, wherein the waveguide is covalently modified with fluorophores in the core and/or cladding.

4. The high-voltage cable accessory according to claim 1, wherein the waveguide comprises the siloxane polymer or a further siloxane polymer.

5. The high-voltage cable accessory according to claim 1, wherein the field-control part has a conductive deflector, which can be contacted with a cable shielding of the high-voltage cable,
and/or wherein the deflector comprises the siloxane polymer or a further siloxane polymer.

6. The high-voltage cable accessory according to claim 1, wherein the siloxane polymer contains various fluorophores and/or wherein the fluorophores of the field-control part are selected such that they are able to convert a fraction of the light signal into radiation in a wavelength region in which the siloxane polymer has a higher transparency than in the wavelength region of the fraction of the light signal, and/or wherein the fluorophores of the field-control part can be excited in a wavelength region below 500 nm, and/or wherein the fluorophores of the field-control part are selected and disposed such that pairs of different fluorophores in the field-control part are able to act as FRET pairs.

7. The high-voltage cable accessory according to claim 1, wherein a reflectivity of the dielectric pigments is greater than 0.8.

8. The high-voltage cable accessory according to claim 1, wherein a proportion by mass of the fluorophores is higher than 5 ppmw, and/or a concentration of the dielectric pigments is higher than 1% by vol.

9. The high-voltage cable accessory according to claim 1, wherein the high-voltage cable accessory is a cable junction box or a cable termination.

10. A high-voltage device comprising a high-voltage cable accessory according to claim 1 and an optical detector, which is coupled with the waveguide.

11. The high-voltage device according to claim 10, further comprising, coupled with the optical detector, a control and evaluation unit, and/or a light source, which is connected to the control and evaluation unit and is disposed inside a housing of the high-voltage cable accessory.

12. A method for the production of a high-voltage cable accessory for the accommodation of a high-voltage cable with a conductor set up for the conduction of electrical current and a cable insulation surrounding the conductor, comprising:
formation of a field-control part, which is transparent or translucent at least in some regions and which comprises a siloxane polymer;
arrangement of the field-control part in a housing of the high-voltage cable accessory, so that the field-control part is able to surround the cable insulation of the high-voltage cable at least partly; and
arrangement of a waveguide in the housing in such a way that the siloxane polymer contains, at least in one partial zone of the field-control part, fluorophores that are covalently coupled to the siloxane polymer and/or to dielectric particles embedded in the siloxane polymer, and/or dielectric pigments, and such that a light signal caused by a partial discharge in the field-control part can be coupled from the field-control part into the waveguide.

13. The method according to claim 12, wherein the formation of the field-control part comprises the mixing of a siloxane system with the fluorophores and/or dielectric pigments for formation of a mixture, the introduction of the mixture and/or of a portion of the waveguide into a mold and/or the polymerization of the mixture in the mold.

14. The method according to claim 12, comprising the arrangement of the waveguide and/or of the dielectric pigments on a surface of the field-control part.

15. Use of a siloxane polymer containing fluorophores and/or dielectric pigments as insulation of a high-voltage device, wherein the fluorophores are covalently coupled to the siloxane polymer and/or to dielectric particles embedded in the siloxane polymer.

16. Use according to claim 15, wherein the insulation contains a field control part.

* * * * *